US005895896A

United States Patent [19]

Alton, Jr.

[11] Patent Number: 5,895,896

[45] Date of Patent: Apr. 20, 1999

[54] FLUID COUPLED SUBWOOFER ACOUSTIC ENCLOSURE SYSTEM WITH PORT CHAMBER

[76] Inventor: Noyal J. Alton, Jr., 2408 Eyre Hall Way, Virginia Beach, Va. 23456

[21] Appl. No.: 08/964,530

[22] Filed: Nov. 5, 1997

Related U.S. Application Data

[60] Provisional application No. 60/046,396, May 13, 1997.

[51] Int. Cl.[6] .......... H05K 5/00

[52] U.S. Cl. .......... 181/145; 181/146; 181/156

[58] Field of Search .......... 181/144, 145, 181/146, 151, 152, 155, 156, 199; 381/154, 158, 159

[56] References Cited

U.S. PATENT DOCUMENTS

| | | | |
|---|---|---|---|
| 4,004,094 | 1/1977 | Ott . | |
| 4,101,736 | 7/1978 | Czerwinski | 181/151 |
| 4,356,882 | 11/1982 | Allen | 181/151 |
| 4,944,019 | 7/1990 | Watanabe | 181/146 |
| 5,073,937 | 12/1991 | Almasy | 181/151 |
| 5,147,986 | 9/1992 | Cockrum et al. | 181/145 |

*Primary Examiner*—Khanh Dang

[57] ABSTRACT

An acoustic enclosure system includes a port chamber between two acoustic chamber assemblies. The port chamber is separated from each of the acoustic chamber assemblies by a wall. Each acoustic chamber assembly includes first and second chambers which are separated by a horizontal wall in which a loudspeaker is mounted. In one of the assemblies, the first chamber is disposed on top of the second chamber. In the other assembly, the first chamber is disposed below the second chamber. The second chambers each have a port that is open to the port chamber. The port chamber has a port that is open to the outside of the enclosure. Each of the first chambers contains a fluid chamber with a flexible bladder that is filled with fluid and maintained at a given distance from the corresponding loudspeaker. A flexible support is provided between each of the bladders and the horizontal wall so that the bladders are each substantially maintained a distance L from the respective horizontal walls.

8 Claims, 3 Drawing Sheets

FLUID COUPLED SUBWOOFER ACOUSTIC ENCLOSURE SYSTEM WITH PORT CHAMBER

This application claims the benefit of U.S. Provisional Application No: 60/046,396, filed May 13, 1997.

FIELD OF THE INVENTION

The invention relates to loudspeaker enclosures and more particularly to a fluid damped acoustic enclosure system.

BACKGROUND OF THE INVENTION

As disclosed in U.S. Pat. No. 5,281,777 issued to Alton, Jr., the contents of which are incorporated herein by reference, a loudspeaker vibrating in isolation produces very little sound. The reason for this is that the waves formed in the front and back of the speaker can effectively cancel each other out. When the loudspeaker's cone is thrust forward, a high-pressure compression is formed in the front and a low pressure rarefaction is formed in the back of the cone. If the wavelength of the sound is large compared to the dimensions of the loudspeaker, an air flow will be set up between the high-pressure and low-pressure regions with the result that the sound intensity is substantially reduced.

To prevent such reduction in sound intensity, a loudspeaker may be mounted in a baffle. The baffle prevents the air in front from communicating with the air in back of the speaker. A baffle is effective as long as the resulting path length between the front and back of the speaker is greater than the wavelength of the sound. In other words, the time required for a disturbance to travel from the front to the back must be greater than one period of the cone's motion.

Loudspeakers however, are not normally mounted in baffles. Typically, loudspeakers are mounted in an enclosure. While such an arrangement prevents the transport of air from the front to the back of the loudspeaker, other problems arise that are related to low frequency audio reproduction. With respect to low frequency audio (1–150 Hertz), the human ear cannot generally detect audio signals below approximately 20 Hz. Yet, the vibrating sensations felt by audio signals below 20 Hz that are typically present during a live performance enhance the listening experience. However, even the best low frequency speaker systems, or sub-woofers as they are known, are only able to efficiently reproduce low frequency signals down to about 15 Hz and generally require a great deal of power to do so.

SUMMARY OF THE INVENTION

Accordingly, it s an object of the present invention to provide an acoustic speaker system that efficiently reproduces low frequency audio signals.

Another object of the present invention is to provide an acoustic speaker system whose low frequency or bass response closely simulates that of actual instrumental tones.

Still another object of the present invention is to provide an acoustic speaker system that efficiently reproduces audio signals below 15 Hz.

Other objects and advantages of the present invention will become more obvious hereinafter in the specification and drawings.

In accordance with the present invention, an acoustic enclosure system for a loudspeaker is provided which includes a port chamber between two acoustic chamber assemblies. The port chamber is separated from each of the acoustic chamber assemblies by a vertical wall. Each acoustic chamber assembly includes first and second chambers which are separated by a horizontal wall in which a loudspeaker is sealably mounted. In one of the assemblies, the first chamber is disposed on top of the second chamber. In the other assembly, the first chamber is disposed below the second chamber. Thus, each of the loudspeakers is oriented to face in opposite directions from each other. The second chambers each have a port in a side wall that is open to the port chamber. The port chamber has a port that is open to the outside of the enclosure. Each of the first chambers is airtight and contains a fluid chamber with a flexible bladder that is filled with fluid and maintained in the first chamber at a given distance from the corresponding loudspeaker. The flexible bladders receive acoustic pressure waves generated by the loudspeakers. Each of the bladders contacts the interior surfaces of the side walls and end piece that form the fluid chamber. A flexible support is provided between each of the bladders and the horizontal wall so that the bladders are each substantially maintained a distance L from the respective horizontal walls. Using this configuration, the entire enclosure cooperates to act as a diaphragm to deliver a signal source.

This enclosure system produces about a 32% increase in vibrational effect over a stacked speaker design. In addition, smoothing of the bass waveform and more accurate definition of the waveform are achieved, which make the output stronger in the tactile response on the body and deliver a much smoother tone.

DETAILED DESCRIPTION OF THE INVENTION

Figure 1:
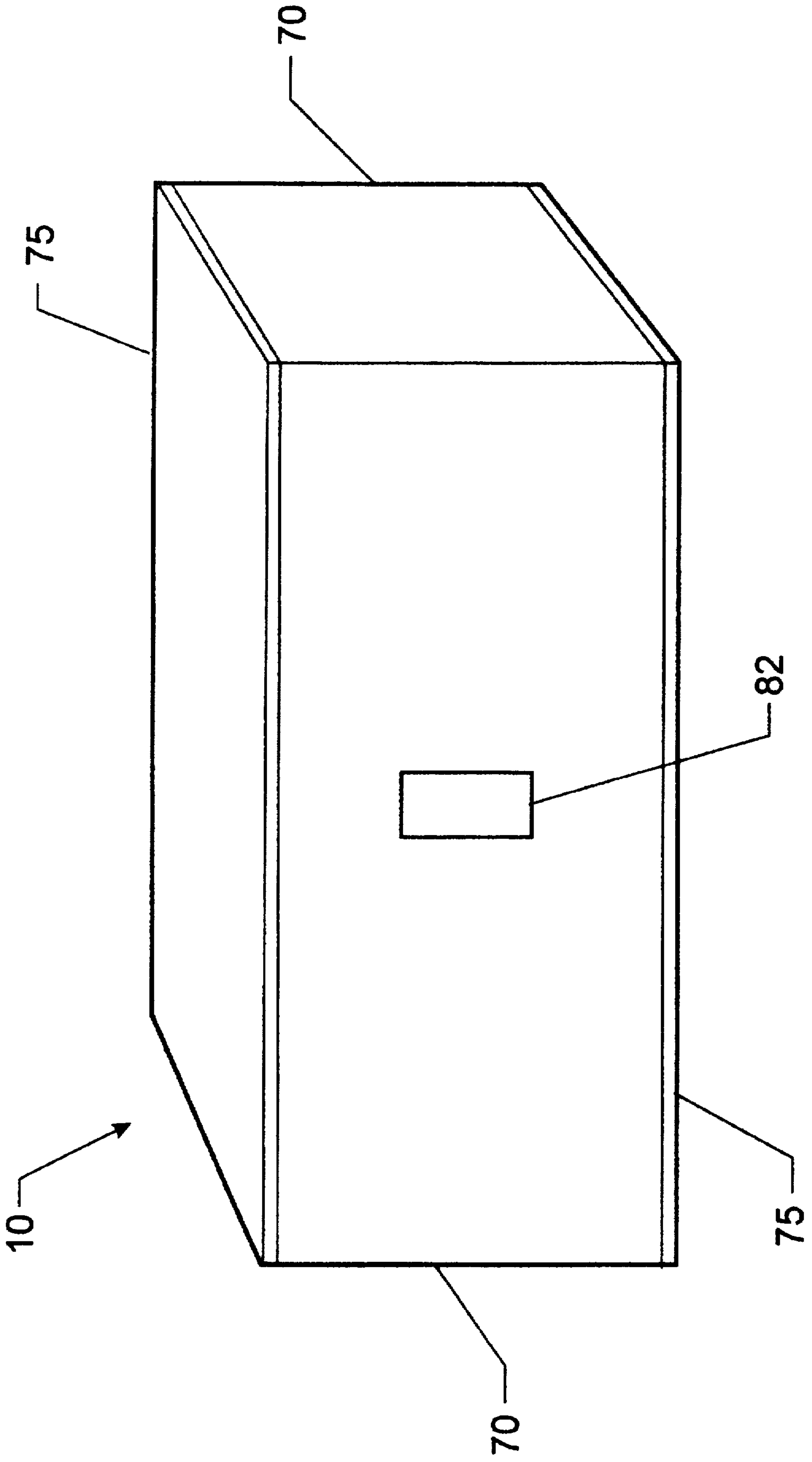
FIG. 1 is perspective view of an acoustic enclosure according to a preferred embodiment of the invention.
Figure 2:
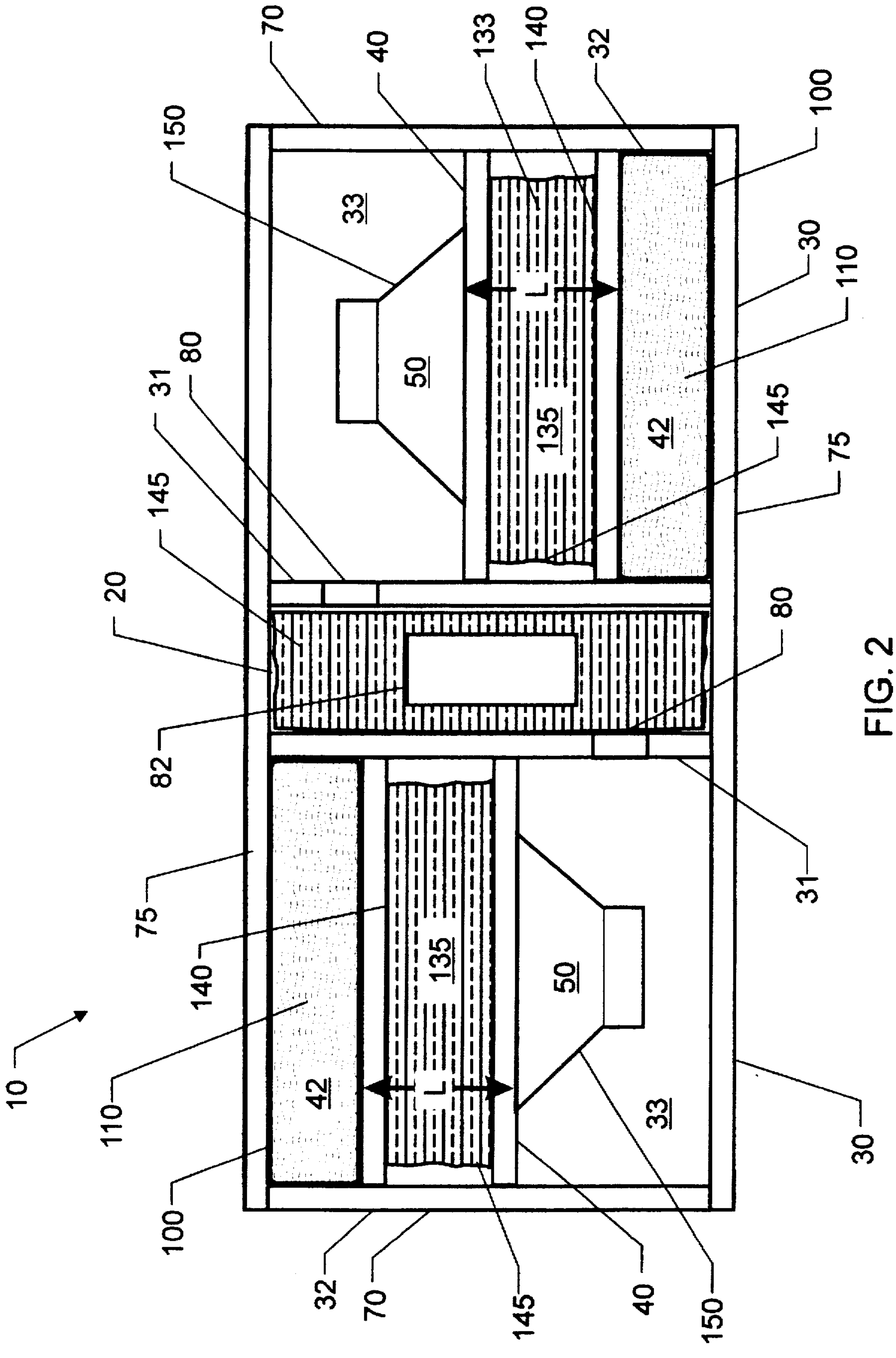
FIG. 2 is a cross sectional view of the acoustic enclosure of FIG. 1.

As shown in FIGS. 1 and 2, an improved acoustic enclosure system 10 includes a port chamber 20 and two acoustic chamber assemblies 30. The port chamber 20 is separated from each of the acoustic chamber assemblies 30 by inner vertical walls 31. Each acoustic chamber assembly 30 includes a first chamber 32 and a second chamber 33 which are separated by a horizontal wall 40 in which a loudspeaker 50 is sealably mounted. In one of the assemblies, the first chamber 32 is disposed on top of the second chamber 33. In the other assembly, the first chamber 32 is disposed below the second chamber 33. Thus, each of the loudspeakers 50 is oriented to face each other. The second chambers 33 each have a port 80 in the inner vertical wall 31 that is open to the port chamber 20. The port chamber 20 has a port 82 that is open to the outside of the enclosure 10. The acoustic chamber assemblies 30 are each further defined by an outer vertical wall 70.

Each second chamber has a loudspeaker 50 mounted in the horizontal wall 40 such that the speaker 50 is positioned over a corresponding opening (not shown) in the horizontal wall 40. The speakers 50 are oriented to face towards each other and can be any conventional low frequency dynamic loudspeakers or woofers, the choice of which is not a limitation on the present invention.

The port chamber 20 and the acoustic chamber assemblies 30 are further defined by outer horizontal walls 75. The outer horizontal walls 75 act as the sound/vibration delivery mechanism (i.e., diaphragm), and may be continuous or segmented. However, the continuous outer horizontal walls 75 generally provide a more continuous waveform than an enclosure having a segmented horizontal walls. If segmented horizontal walls are used, they should be designed to continue the development of the waveform.

The first chambers 32 further include a fluid chamber 42 which houses a flexible bladder 100 a distance L from the corresponding loudspeaker 50. The bladders 100 are filled with a liquid 110 via a valve (not shown). Once filled, the bladders 100 may be permanently sealed and installed in their respective fluid chambers 42. Alternatively, the valve may be a resealable valve and the bladder 100 may be removable with respect to the fluid chamber 42 to facilitate the filling and emptying of the bladder 100. The liquid 110 is selected such that it remains in its liquid phase throughout the range of expected operating temperatures of the system. For most purposes, the liquid 110 may be water. However, if operation of the system 10 at colder temperatures is required, salt water or water with an antifreeze additive may be appropriate. Conversely, at extremely high temperatures, a water/coolant mixture may be required to prevent boiling. The amount of water or mixture thereof used to fill bladder 100 is approximately equal to one gallon of liquid for every 2" of loudspeaker diameter D. For example, if loudspeaker 50 has an 18" diameter, 9 gallons of liquid 110 are required to fill bladder 100.

Figure 3:
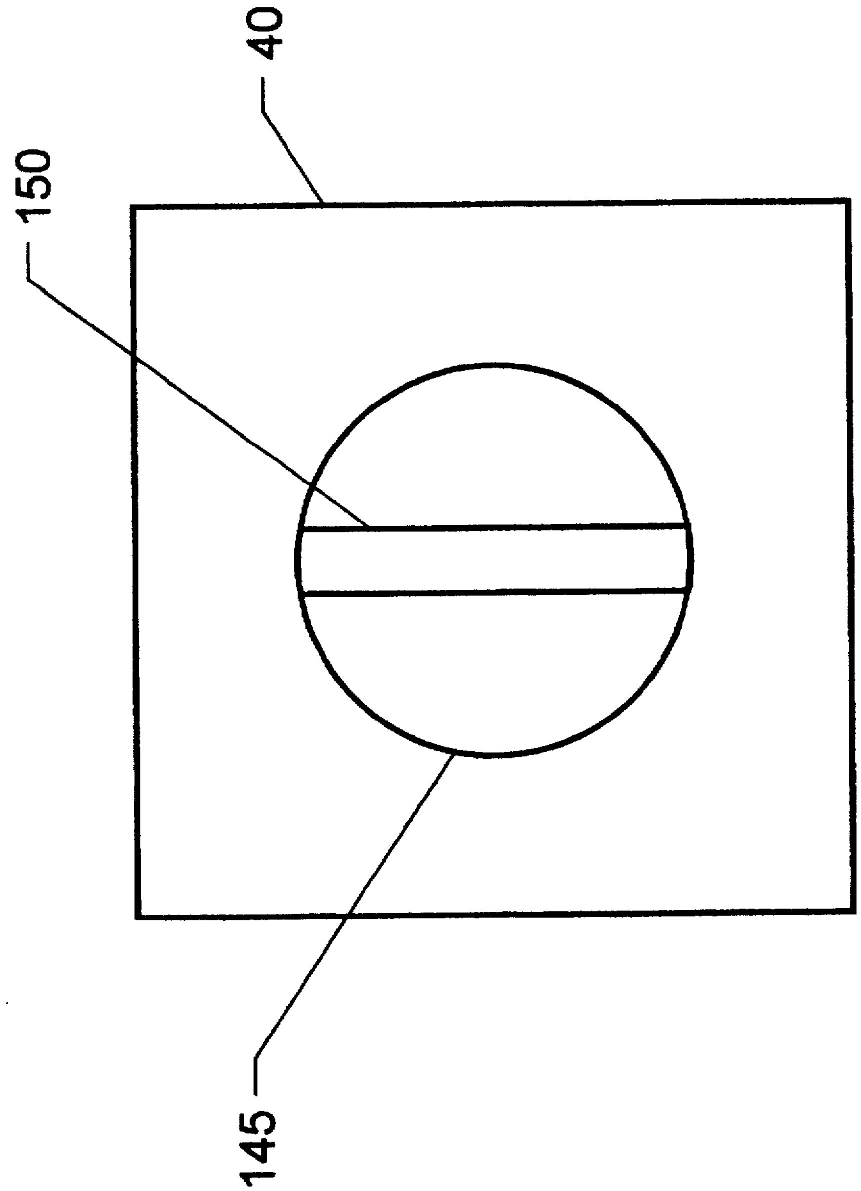
FIG. 3 is a plan view of one embodiment of a bladder support.

Each bladder 100 is supported and maintained at the distance L from corresponding loudspeaker 50 by the flexible wall 140 that is fixed to and supported at the vertical walls 31, 70 of the acoustic chamber assembly 30 and further defines the fluid chamber 42. To simplify the discussion and analysis of the present invention, it will be assumed that the flexible wall 140 is generally horizontal such that L is substantially constant. As shown in FIG. 3, flexible wall 140 is designed with an opening 145 spanned by a crossbar 150 to allow sound pressure generated by the loudspeakers 50 to pass therethrough.

As each bladder 100 is filled, it expands to substantially fully contact the interior of the fluid chamber 42. The bladder 100 is filled so that the fluid contents are under a pressure of about 2–3 psi. The bladder 100 may be installed from the outer vertical walls 70 of the enclosure; thus, the outer vertical walls 70 are generally a removable part of the enclosure that may be sealed in place by any conventional means. If the bladders 100 are to be emptied and filled from time to time, the valve may be resealable and extend through and be sealed in one of the outer vertical walls 70.

The spaces between the horizontal walls 40 and the flexible walls 140 act as compression chambers 135 and are sized to about 75% of industry recommended standards. Although industry standards may be used to size the compression chambers 135, such chambers 135 would have decreased output and decreased tactile delivery, since higher pressure in the compression chamber 135 results in more interaction of the liquid with the exterior walls. The compression chambers 135 are preferably insulated at the interior of the inner vertical walls 70 using about ¾ inch speaker enclosure insulation 145. In addition, the port chamber 20 is filled with insulation 145. Although the compression chambers 135 may be uninsulated, the insulation 145 has the beneficial effect of decreasing the air compression on the vertical walls 31, 70 so the fluid vibrational effect on the outer horizontal walls 75 is more effectively used. The use of insulation 145 reduces the phase and frequency interference at the vertical walls 31, 70 that arise as a result of vibrations delivered through the compression chambers 135, fluid chambers 42 and second chambers 33. Thus, the vibrational effect on the outer horizontal walls 75 effectively comes only from the fluid chambers 42.

In operation, the flexible cone 150 of each loudspeaker 50 generates sound pressure waves of equal and opposite magnitude into both the second chamber 33 and the adjacent acoustic assembly chamber 32. With respect to each of the acoustic assembly chambers 32, the waves impinge upon and pass through the flexible wall 40 through the opening 140. The underside of each bladder 100 receives the waves and transmits them through the liquid 110. The waves propagate through the liquid 110 and are coupled to the horizontal walls 75 and side walls 70. In this way, sound waves are coupled to relatively rigid radiating surfaces, namely, the enclosure. Since each pressurized bladder 100 is in full contact with the horizontal walls 75 and a respective side wall 70, there is improved tactile delivery, i.e., the vibrational portion of the signal is more effectively delivered. It has also been found that heating the liquid 110 increases the effective delivery of the vibrational portion of the signal.

Typically, a portion of each pressure wave is simultaneously reflected back towards its source, i.e., speaker 50, causing a reflective damping effect in the area of each of the compression chambers 135 and on cone 150. In order to prevent the occurrence of the reflective wave, a fluid dampening material, such as a dacron polyester material as provided in the Wave Reduction Waterbed System™ available from Vinyl Products, Carson City, Nev., may be added to the fluid 110.

It is to be understood that the aforedescribed invention will apply to a variety of enclosure shapes and materials used therefore. For example, the enclosure might be cylindrical, rectangular, octagonal, etc. The size of the enclosure may vary, as well as the relative dimensions of the various chambers. As an example only, an enclosure may be about 17 inches high, 17 inches deep and 37 inches long, with the fluid chambers, compression chambers and second chambers being about 5, 4½ and 6 inches deep respectively.

The enclosure is rigidly constructed from a dense material that is typically screwed and glued together. For best radiating characteristics, the material used to construct the enclosure is birch or oak, since these materials have low enough resonances and high density. However, other materials may be used as long as the harmonic resonance of the material is low enough to resonate at the desired low frequencies.

The flexible wall 140 must be strong enough to support the fluid-filled bladder 100 and yet flex as part of a complex spring system that includes the fluid-filled bladder 100 and loudspeaker cone 150. The flexible wall 140 may have openings with alternate configurations such as a plurality of circular perforations which allow the passage of pressure waves as described above. While the shape and arrangement of any openings or perforations should be such that the structural integrity of flexible wall 140 is not jeopardized, the specifics relating to openings or perforations and their arrangement are not a limitation on the present invention.

The bladder 100 may be constructed from any flexible, liquid-impermeable material such as polyvinyl or rubber. Dimensions of the bladder 100 are selected such that when the required amount of liquid fills same, the bladder 100 contacts the entire interior surfaces of the fluid chamber 42. Although the invention has been described with reference to the use of a bladder 100 to hold the liquid 110, it should be understood that the bladder 100 functions to hold the pressured liquid while fully contacting the interior surfaces of the fluid chamber 42. In addition, the surface of the bladder 100 facing the loudspeaker 50 should be exposed to receive pressure waves from the speaker 50. Thus, it is possible that alternate embodiments of the invention may use other fluid-containing means. For example, a flexible, semi-rigid material may be used to line the interior of the side walls and end pieces and extend across the inside of the enclosure to form the fluid chamber such that it may be unnecessary to support the fluid chamber with a horizontal wall. In this way, the fluid chamber itself acts a the "bladder" and holds the fluid.

The advantages of the present invention are numerous. The dual acoustic chamber assemblies 30 disposed side-by-side about a port chamber 20 permits the larger horizontal walls 75 to act as a diaphragm for the system 10. Thus, the system 10 is capable of producing an improved output which has a stronger tactile effect on the body. The acoustic enclosure system described herein efficiently reproduces audible and subaudible frequencies from 6–150 Hz. Further, by producing a range of resonant frequencies centered about each point resonant frequency, a full low frequency response is achieved.

What is claimed is:

1. An acoustic enclosure system for a loudspeaker comprising:

an enclosure having at least one side wall and two end pieces, said enclosure defining a port chamber between two side chambers, wherein each side chamber is separated from the port chamber by a vertical inner wall, said port chamber having a port in the at least one side wall communicating with the exterior of said enclosure;

each side chamber further comprising a horizontal speaker wall which further divides the side chamber into a first chamber and a second chamber;

a loudspeaker mounted in the speaker wall such that the loudspeaker faces the first chamber; and a fluid chamber spaced a distance from the loudspeaker, wherein said fluid chamber contains fluid and is substantially in full contact with at least one side wall and the end piece;

wherein each of the loudspeakers face in opposite directions.

2. The acoustic enclosure system of claim 1, wherein the fluid is under pressure.

3. The acoustic enclosure system of claim 2, wherein each fluid chamber further comprises a flexible bladder, each of said flexible bladders holding fluid and being in substantially full contact with the at least one side wall and the corresponding end piece.

4. The acoustic enclosure system of claim 3, wherein each side chamber further comprises a flexible wall having at least one opening, each of said flexible walls being fixed to the at least one side wall and positioned between a flexible bladder and a speaker to support the fluid chamber a desired distance from a corresponding speaker, wherein the at least one side wall, the speaker wall, the flexible wall and the vertical wall further define a compression chamber within each side chamber.

5. The acoustic enclosure system of claim 4, further comprising insulation disposed at the interior walls of the port chamber.

6. The acoustic enclosure system of claim 5, further comprising insulation disposed in the compression chambers at the at least one side wall and the vertical inner walls.

7. The acoustic enclosure system of claim 6, further comprising a fluid dampening material in the fluid.

8. The acoustic enclosure system of claim 7, further comprising at least four side walls, wherein said side walls and the end pieces are wood capable of resonating at specified low frequencies.

* * * * *